United States Patent
Takeshita et al.

(10) Patent No.: US 7,485,023 B2
(45) Date of Patent: Feb. 3, 2009

(54) ORGANIC ELECTROLUMINESCENT DEVICE HAVING PARTITION WALL AND A MANUFACTURING METHOD OF THE SAME BY RELIEF PRINTING METHOD

(75) Inventors: Koji Takeshita, Tokyo (JP); Takahisa Shimizu, Tokyo (JP); Hironori Kawakami, Tokyo (JP); Yifan Qian, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 387 days.

(21) Appl. No.: 11/391,790

(22) Filed: Mar. 28, 2006

(65) Prior Publication Data

US 2006/0220537 A1 Oct. 5, 2006

(30) Foreign Application Priority Data

Mar. 31, 2005 (JP) ............................. 2005-101265
Sep. 20, 2005 (JP) ............................. 2005-271593

(51) Int. Cl.
*H05B 33/00* (2006.01)
(52) U.S. Cl. ........................................ 445/23; 313/504
(58) Field of Classification Search ......... 313/503–506; 428/690; 445/23
See application file for complete search history.

(56) References Cited

U.S. PATENT DOCUMENTS 6,420,200 B1   7/2002  Yamazaki et al.
6,582,504 B1   6/2003  Fujita
2003/0230967 A1*  12/2003  Kawamura et al. .......... 313/483
2004/0021413 A1   2/2004  Ito et al.

FOREIGN PATENT DOCUMENTS

| JP | 05-078655 | 3/1993 |
| JP | 10-012377 | 1/1998 |
| JP | 10-077467 | 3/1998 |
| JP | 11-024604 | 1/1999 |
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-305077 | 10/2002 |
| JP | 2002-313561 | 10/2002 |
| JP | 2003-059654 | 2/2003 |
| JP | 2003-059656 | 2/2003 |
| JP | 2003-243163 | 8/2003 |
| JP | 2003-282244 | 10/2003 |
| JP | 2004-055333 | 2/2004 |
| JP | 2004-063359 | 2/2004 |
| JP | 2004-355913 | 12/2004 |
| WO | WO 99/10862 | 4/1999 |

* cited by examiner

*Primary Examiner*—Joseph L Williams
(74) *Attorney, Agent, or Firm*—Squire, Sanders & Dempsey, L.L.P.

(57) ABSTRACT

A method of manufacturing an organic electroluminescent device is disclosed. The method includes forming a first electrode or a substrate; forming a partition wall adjacent to the first electrode; and forming an organic luminous layer on the first electrode by relief printing method.

6 Claims, 4 Drawing Sheets

ORGANIC ELECTROLUMINESCENT DEVICE HAVING PARTITION WALL AND A MANUFACTURING METHOD OF THE SAME BY RELIEF PRINTING METHOD

CROSS REFERENCE

This application claims priority to Japanese application number 2005-101265, filed on Mar. 31, 2005, and priority to Japanese application number 2005-271593, filed on Sep. 20, 2005, which are incorporated herein by reference.

BACKGROUND OF THE INVENTION

1. Field of the Invention

The present invention is related to an organic electroluminescent device having organic luminous layer comprising high polymeric material and the manufacturing method. The present invention is related to an organic electroluminescent device and the manufacturing method to form organic luminous layer by a printing method.

2. Description of the Related Art

An organic luminous layer comprising organic luminescent material can be formed between two opposed electrodes. When electric current is applied to organic luminous layer, organic luminous layer emits light. Thickness of organic luminous layer is important for improvement of efficiency of luminescence. The thickness should be around 100 nm. Even more particularly, pattern of high accuracy should be formed to make a display panel.

In organic luminescent material forming organic luminous layer, there are low molecular materials and high polymeric materials. Generally, with low molecular materials, thin film can be formed by vacuum evaporation. A mask with minute pattern is used, and patterning is performed. In this approach, upsizing of the substrate results in diminishing of pattern accuracy. In addition, it is layered in vacuum, therefore, the throughput is bad.

Thus, conventionally, a high polymeric material is dissolved in solvent, and coating slip is made. Method to form thin film is tried by the wet coating method using this coating slip. Wet coating method to form thin film, include spin coating method, bar coat method, extrusion coat method, and dip coat method. It is difficult to do patterning with high accuracy by these wet coating methods. It is difficult to paint with the state that three colors were divided into of RGB by these wet coating methods. A printing method is good at formation of separated pattern. Therefore, it is thought that formation of thin film by a printing method is the more effective method.

Macromolecular organic luminescent material is dissolved in a solvent. And organic luminescence ink is made. In this case, in point of solubility of organic luminescent material, density of organic luminescent material should be around 1%. Methods to print organic luminescence ink include the following methods: Offset printing to use elastic rubber blanket (Japanese Patent Laid-Open No. 2001-93668 Official Gazette), relief printing method to use elastic rubber printing plate and resin printing plate (Japanese Patent Laid-Open No. 2001-155858 Official Gazette), ink jet method (Japanese Patent Laid-Open No. 2002-305077 Official Gazette).

SUMMARY OF THE INVENTION

Organic luminescence ink is used by relief printing method, and an organic electroluminescent device is formed. In this case, because of the spreading of ink, ink is mixed in neighboring organic luminous layer. Partition wall is comprised to prevent a color from being mixed. Partition wall should be partition wall of some height to prevent a color from being mixed. The second electrode steps over partition wall. When partition wall is high, the second electrode is snapped.

According to an embodiment the present invention, in an organic electroluminescent device, the organic luminescence ink that organic luminescent material is scattered in stability to solvent is printed on part partitioned off by partition wall. In this case, organic luminescence ink does not spread in a pixel of a neighboring different luminescent color. Mixing of the color is prevented. Accordingly, a high minute organic electroluminescent device without failure of display by disconnection of the second electrode is provided.

DESCRIPTION OF THE PREFERRED EMBODIMENTS

Figure 1A:
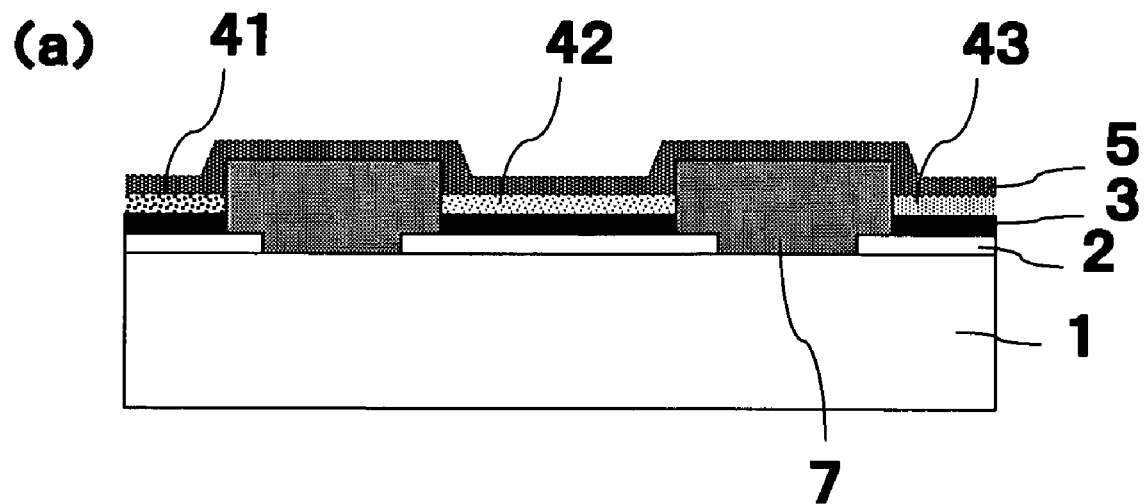
FIG. 1A shows scheme of organic electroluminescent device profile of organic electroluminescence panel of the present invention.
Figure 1B:
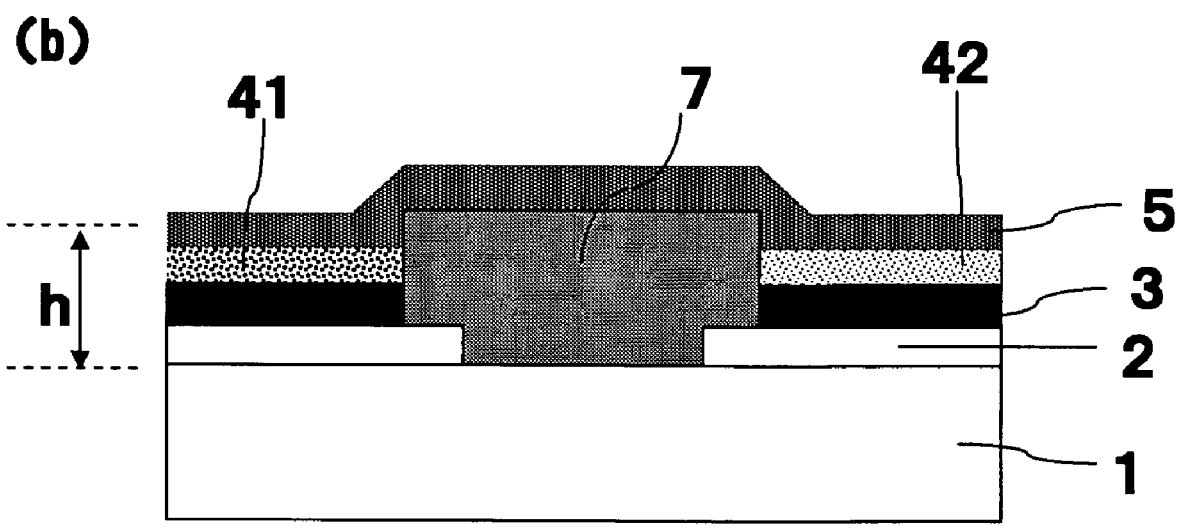
FIG. 1B is an extended figure of FIG. 1A.

Embodiments of an organic electroluminescent device of the present invention are explained. Illustration cross figure of an organic electroluminescent device of the present invention is shown in FIG. 1. But the present invention is not limited by the examples. In addition, FIG. 1 (b) is the figure that FIG. 1 (a) is extended.

Figure 2:
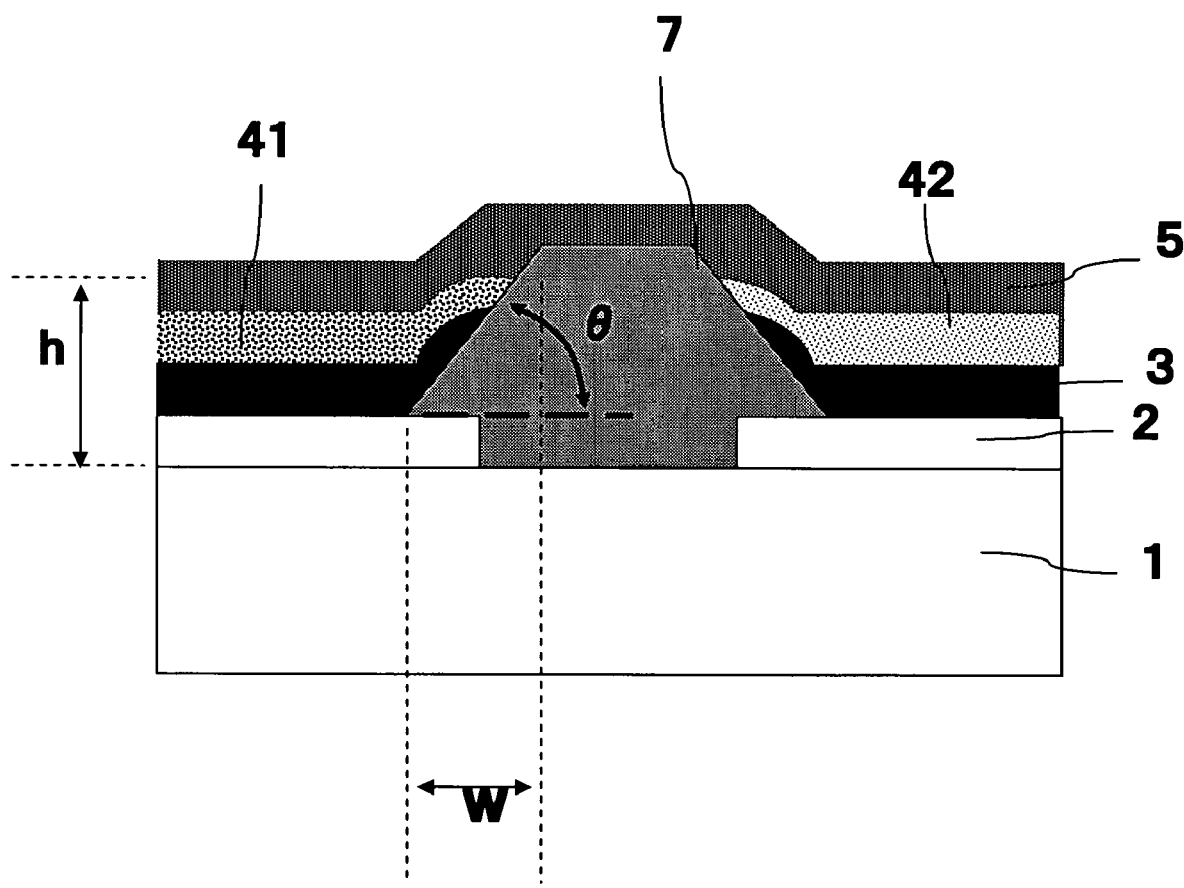
FIG. 2 shows a schematic illustration of relief printing device in the present invention.

In FIG. 2, pattern-shaped first electrode 2 is formed on substrate 1. When a drive type of an organic electroluminescent device is passive matrix type, this first electrode 2 is electrode of stripe-shaped pattern. In the case of active matrix type, the first electrode 2 is electrode of pattern formed by every pixel.

For driving type of an organic electroluminescent device, passive matrix type and active matrix type are exemplified. An organic electroluminescent device of the present invention can be applied to both organic electroluminescent device of a passive matrix type and an organic electroluminescent device of an active matrix type. An organic electroluminescent device of a passive matrix type is the organic electroluminescent device which include stripe-shaped electrodes that are opposed to with perpendicular state. It emits light in the intersection point. On the other hand, an active matrix type has so-called thin film transistor (TFT) substrate. Transistor is formed with every pixel. In active matrix type, light is emitted by every pixel independently.

Partition wall 7 is formed between patternized first electrodes 2. It is preferable for partition wall to be formed to cover the first electrode end. A short-circuit between the first electrode and the second electrode can be prevented by covering the first electrode edge. In the case of an organic electroluminescent device of passive matrix type, partition wall is formed in the shape of stripe. In the case of an organic electroluminescent device of active matrix type, partition wall is formed in the shape of a grating.

An organic luminescence media layer including organic luminous layer is formed in the first electrode partitioned off by partition wall. The organic luminescence media layer is a layer stack having layers such as a hole implant layer, a hole transport layer, a electron blocking layer, a electron transport layer and an electron injection layer besides organic luminous layer.

In FIG. 2, a hole transport layer 3, organic luminous layer (41, 42) are comprised on the first electrode 2. As for the organic luminous layer, there are patterns of red (R) organic luminous layer 41, green (G) organic luminous layer 42 and blue (B) organic luminous layer 43. The second electrode 5 is placed over organic luminescence media layer. The first electrode 2 faces with the second electrode 5. Stripe-shaped second electrode 5 comprises to be perpendicular to stripe-shaped first electrode in the case of passive matrix type. In the case of active matrix type, second electrode 5 is formed on a whole area of an organic electroluminescent device.

As for partition wall 7 in the present invention, it is desirable for height h to be 0.5 µm-5 µm. As for height h of partition wall 7, it is more preferable to be 1.0 µm-1.8 µm. When partition wall is too low, spreading of line width of the organic luminous layer cannot be prevented. A color is mixed. On the contrary, the cathode layer which is perpendicular to partition wall is snapped when partition wall is too high. Display becomes poor. In other words when height of partition wall is 0.5 µm, mixed color by spreading of organic luminescence ink can be prevented. When height of partition wall is equal to or less than 5 µm, disconnection of the second electrode can be prevented.

But height of the partition wall which can prevent spreading of line width of the organic luminous layer depends on both ink amount supplied on a pixel line and width of pixel line. When width of pixel electrode line partitioned off by partition wall is 80 µm-200 µm, and desired thickness of organic luminous layer is 50 nm-100 nm, and the organic luminescence ink that organic luminescent material concentration is 1% is used, height of preferred partition wall can be higher than 0.51 µm. However, if these condition change, necessary height of partition wall can change.

Thus, height of preferred partition wall is higher than 1.0 µm when the organic luminescence ink of organic luminescent material has a density of 0.5% which is an half density of above example. When organic luminescence layer thickness is 100 nm-200 nm, height of preferred partition wall can be higher than 1.0 µm. In addition, when height of partition wall is more than 2 µm, one coating by spin coating method can produce unevenness of thickness of coating. In addition, in the case of one exposure/developing, pattern formation is insufficient. Therefore, coating should be done more than twice. And exposure/developing should be done. However, this leads to an increase in cost. Therefore, in some embodiments, the height of the more preferred partition wall is 1.0 µm-1.81 µm.

In addition, partition wall should have a hem, and it is preferable for the hem to cover edges of the first electrode. Organic luminescence media layers of organic luminous layer or hole transport layer are formed by wet method such as relief printing method or a spin coating method. For this case, when the material can easily stick to the partition wall, fluid gathering can occur in a bottom of partition wall. Because of this, an organic luminescence media layer with a nonuniform film thickness can be formed. Luminescence unevenness may occur.

According to the current invention, there is a hem in partition wall 7 for prevention of short circuit. Therefore, when organic luminescence media layer is formed, fluid gathering in a partition wall bottom remains in a hem portion of partition wall. Illustration cross figure of an organic electroluminescent device of the present invention is shown in FIG. 2. Partition wall has a hem. When an organic electroluminescent device emits light, a hem part does not emit light. There is liquid gathering on a hem. Therefore, a portion of liquid gathering is out of a light emitting area. Uniformity of film thickness of an organic luminescence media layer located in the pixel part that is a light emitting area is improved. Organic electroluminescence elements without luminescence unevenness can be produced.

In addition, a hem can have a tapered configuration. Preferably, acroteric angle θ of a hem is less than 45°. When angle θ is less than 45°, an organic luminescence media layer falls on this hem, and fluid gathering remains in this hem.

In addition, it is preferable for width W of a hem of partition wall to be more than 0.5 µm. When width of a hem is equal to or less than 0.5 µm, liquid gathering does not remain sufficiently in a hem portion of partition wall. In addition, in some embodiments width of a hem can be half of partition wall width at the maximum.

A manufacturing method of an organic electroluminescent device of the present invention is described next.

An organic electroluminescent device of embodiments of the present invention is formed on substrate 1. For substrate 1, a glass substrate, a metal plate and a film or sheet made of plastic can be used. In the case of bottom emission mode, a substrate has to be transmittance. If a film made of plastic is used as substrate 1, organic electroluminescent devices can be produced by reel up. Therefore, an inexpensive display panel can be provided. For example, for the plastic, polyethylene terephthalate, polypropylene, cyclo olefin polymers, polyamide, polyethersulfone, polymethyl methacrylate, and polycarbonate can be used. In addition, barrier layer of steam barrier property and oxygen barrier property can be formed on this film, if necessary. For material of barrier layer, metallic oxide such as silicon oxide, oxidation nitride such as silicon nitride, polyvinylidene chloride, polyvinyl chloride, ethylene-vinyl acetate copolymer saponification material are exemplified.

Figure 3:
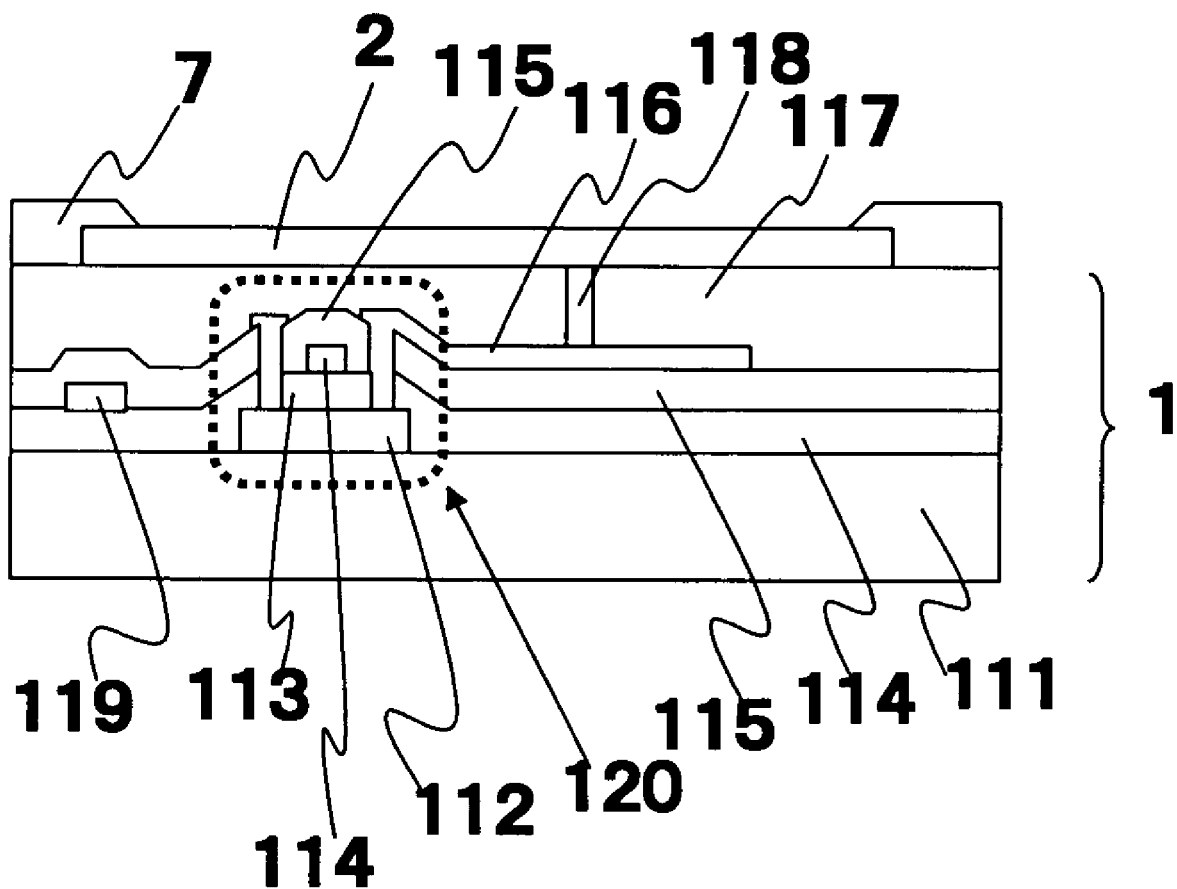
FIG. 3 shows a cross section of a substrate of an active matrix type.

In addition, thin film transistor (TFT) is formed on a substrate, and a substrate for an organic electroluminescent device of active matrix type can be made. A cross section of an example of a substrate of an active matrix type of an embodiment of the present invention is shown in FIG. 3. As for the organic electroluminescent device substrate of the present invention, planarizing layer 117 can be formed on TFT 120. A bottom electrode (the first electrode 2) of an organic electroluminescent device can be on planarizing layer 117. And, by means of contact hole 118 in planarizing layer 117, a bottom electrode should be electrically connected to TFT. By reason of such a configuration, TFT is sufficiently electrical insulation state with organic electroluminescent device.

TFT 120 and the upward organic electroluminescent device are supported with support medium 111. It is desirable for mechanical intensity of support medium 111 to be high. In addition, it is desirable for dimensional stability of support medium 111 to be high. Material for the substrate can be used as material of support medium 111.

For thin film transistor 120 on support medium 111, well-known thin film transistor can be used. By way of example only, thin film transistor having the active layer that a source/drain region and a channel area are formed, the gate insulator and the gate electrode is exemplified. Configuration of thin film transistor is not limited to this configuration. By way of example only, staggered type, reverse staggered type, top gate type, and coplanar type are exemplified.

Active layer 112 can encompass many embodiments. By way of example only, it can be formed by inorganic semiconductor material such as amorphia Si, polycrystalline silicon, crystallite Si, cadmium selenide or organic semiconductor material such as thiophene oligomer, and poly(phenylene vinylene).

A manufacturing method of these active layers is exemplified below. Method to do ion doping after laminating by plasma CVD technique of amorphous silicon. Can comprise the following processes: Formation of amorphous silicon by LPCVD method with the use of $SiH_4$ gas; Formation of a polySi by crystallization of amorphous silicon by solid phase epitaxy; and Ion doping by ion implantation method.

Method (low temperature processing) comprising the following processes: Formation of amorphous silicon by LPCVD method with the use of $Si_2H_6$ gas (or formation of amorphous silicon by PECVD method with the use of $SiH_4$ gas.); Annealing by laser such as excimer laser; Formation of a polySi by crystallization of amorphous silicon; and Ion doping by ion doping method.

Method (high temperature processing) comprising the following processes: Laminating of a polySi by low pressure CVD method or LPCVD method; Formation of gate insulator by thermal oxidation more than 1,000 degrees Celsius; Formation of gate electrode 114 of an n+ polySi to the top; and Ion doping by ion implantation method.

For gate insulator 113, conventional gate insulator can be used. By way of example only, $SiO_2$ formed by PECVD method or LPCVD method, $SiO_2$ provided by thermal oxidation of polysilicon film can be used.

For gate electrode 114, conventional gate electrode can be used. Metal such as aluminum, copper, refractory metal such as titanium, tantalum and tungsten, a polySi, silicide of refractory metal, or polycide can be used.

For thin film transistor 120, a single gate structure, a double gate structure, multiple gating configuration having gate electrodes more than 3 are exemplified. In addition, even LDD configuration and offset configuration are preferable. Even more particularly, thin film transistors more than 2 may be placed on one pixel.

As for the display unit of the present invention, thin film transistor has to function as a switching element of organic electroluminescent device. Drain electrode 116 of transistor and pixel electrode (the first electrode 2) of organic electroluminescent device are connected electrically. Even more particularly, generally, for pixel electrode (the first electrode 2) for top emission configuration, it is necessary for metal reflecting back light to be used.

Drain electrode 116 of thin film transistor 120 is connected with pixel electrode (the first electrode 2) of organic electroluminescent device by electric wiring. This electric wiring is formed in contact hole 118 penetrating through flattening membrane 117.

Material of flattening membrane 117 is exemplified below. Inorganic materials such as $SiO_2$, spin-on-glass, $SiN(Si_3N_4)$, $TaO(Ta_2O_5)$, organic materials such as polyimide resin, acrylic resin, photoresist material, and black matrix material can be used. Manufacturing methods such as spin coating, CVD and evaporation method can be selected depending on these materials. If necessary, a photosensitive resin is used as a planarizing layer 117, and contact hole 118 is formed by procedure of photolithography in position corresponding to thin film transistor 120. Or after having formed a planarizing layer on the entire surface, contact hole 118 is formed by dry etching or wet etching in position corresponding to thin film transistor 120. Contact hole 118 is buried by conductive material. Then contact hole is connected with pixel electrode electrically. A planarizing layer 117 should be able to cover up lower TFT, capacitor and electric wiring. For example, thickness of a planarizing layer should be several µm of around 3 µm.

The first electrode is comprised on a substrate. When the first electrode is anode, the following material can be used: Metal complex oxide such as ITO (indium tin complex oxide), IZO (indium zinc complex oxide), stannic oxide, zinc oxide, indium oxide, zinc aluminium complex oxide, metallic substances such as gold, platinum, or chromium, or these layer stacks. For formation method of the first electrode, dry membrane making method such as resistance heating evaporation method, electron-beam evaporation technique, reactivity evaporation method, ion plating method and sputtering method can be used depending on the kind of materials used.

In addition, ITO is preferable for reasons including low electrical resistance, high resistance against solvent, and high translucency (in the case of bottom emission). ITO is formed on a glass substrate by sputter method. Patterning of ITO is done by photolithography method, and the first electrode of ITO is formed.

Photosensitive materials can be used as formation material of partition wall. For photosensitive materials, both positive type and negative type are usable. By way of example only, a light hardening resin such as photo radical polymerization type and photo cation cure corollary, copolymer containing acrylonitrile composition, poly vinylphenol, polyvinyl alcohol, novolac resin, polyimide resin and cyanoethyl pullulan can be used.

When formation material of partition wall is a photosensitive material, partition wall can be formed by the following method: Solution of formation material is coated onto a whole area by slit coat method or spin coating method. Patterning is performed by photolithography method. In the case of spin coating method, height of partition wall can be controlled under condition of rotation number. However, the height which can be formed by one coating is limited. When partition wall having a height more than the limited height is formed, spin coat is repeated multiple times.

When partition wall is formed by photolithography method using a photosensitive material, configuration of partition wall is controllable by exposure condition and development condition. An example is described below. A photosensitive resin of negative type is used. By exposure, development and post-bake, partition wall is formed. Partition wall end has a tapered configuration, and partition wall has a hem part. Development conditions such as a kind, density, temperature of a photographic developer or developing time should be controlled to form the partition wall. When condition of development is mild, the following partition wall is formed. Partition wall end has a tapered configuration. There is a hem in footing of partition wall. On the contrary, when development condition is strong, the following partition wall is formed. Configuration of a partition wall end is inverse configuration of taper configuration. Partition wall does not comprise a hem.

In addition, when formation material of partition wall is metallic oxide or a metal nitride, partition wall can be formed by dry membrane making method such as sputtering method or chemical vapor deposition. For this case, patterning of partition wall can be performed by mask or photolithography method.

After having formed partition wall 7, hole transport layer 3 is formed. A poly aniline derivative, poly thiophenes, a polyvinylcarbazole (PVK) derivative, poly(3,4-ethylenedioxy thiophene) (PEDOT) are exemplified for hole transport layer formation material. Hole transport material ink is made by dissolution of these materials in solvent. As method to coat with this ink, the methods include coating methods using a slit coating machine, a spin coater, a bar coating machine, a roll coater, a die coating machine and an engraved-roll coater. Various printing methods include offset printing, relief printing plate process, ink jet method, and screen printing.

For solvent for dissolution of hole transport layer formation material, the following material is exemplified: Toluene, dimethylbenzene, acetone, methyl ethyl ketone, methyl isobutyl ketone, cyclohexanone, methanol, ethanol, isopropyl alcohol, ethyl acetate, butyl acetate, water, and mixture thereof. Water or alcohols are especially preferred. In addition, detergent, antioxidant, viscosity improver, UV absorber may be added in this ink. But these additives must not affect luminescence property of an organic electroluminescence display unit.

In addition, before formation of a hole transport layer, surface treatment of the substrate such as plasma treatment, UV processing, UV ozonization may be performed. Then affinity of the first electrode with hole transport ink improves.

After formation of hole transport layer 3, organic luminous layer (41, 42, 43) is formed. By means of electric current being applied, organic luminous layer emits light. For example, in the case of organic electroluminescent device of full color, as for the organic luminous layer, patterns of red organic luminous layer, green organic luminous layer and blue organic luminous layer are formed.

Organic luminescent material of organic luminous layer is exemplified below.

Low molecular luminescent material is exemplified below. 9,10-diaryl anthracenes, pyrene, coronene, perylene, rubrene, 1,1,4,4-tetraphenylbutadiene, tris(8-hydroxyquinolonate) aluminium complex, tris(4-methyl-8-hydroxyquinolonate) aluminium complex, bis(8-hydroxyquinolonate) zinc complex, tris(4-methyl-5-trifluoromethyl-8-hydroxyquinolonate) aluminium complex, tris(4-methyl-5-cyano-8-hydroxyquinolonate) aluminium complex, bis(2-methyl-5-trifluoromethyl-8-quinolinolate)[4-(4-cyanophenyl) Phenolate]aluminium complex, tris (8-quinolinolate) scandium complex, bis[8-(para-tosyl)aminoquinoline]zinc complex and cadmium complex, 1,2,3,4-tetraphenylcyclopentadiene.

The materials which scattered following low molecular type luminescent materials in macromolecule can be used. Coumarin corollary fluorescent substance, perylene corollary fluorescent substance, pyran type fluorescent substance, anthrone corollary fluorescent substance, porphyrin corollary fluorescent substance, quinacridon corollary fluorescent substance, N,N'-dialkyl displacement quinacridon type fluorescent substance, naphthalimido type fluorescent substance, N,N'-diaryl displacement pyrrolo pyrrole series fluorescent substance, and phosphorescence fluor such as Ir chelate.

Polystyrene, polymethyl methacrylate and polyvinylcarbazole can be used as macromolecule.

In addition, the following macromolecule luminescent materials are usable. Poly(2-decyloxy-1,4-phenylene) (DO-PPP), poly[2,5-bis-[2-(N,N,N-triethylammonium)ethoxy]-1,4-phenyl-alto-1,4-phenyl Ren] fly jib loma id (PPP-NEt3+), poly[2-(2'-Ethyl hexyloxy)-5-methoxy-1,4-phenylenevinylene] (MEH-PPV), poly[5-methoxy-(2-propanoxysulfide) 1,4-phenylenevinylene] MPS-PPV), 1,4-poly[2,5-bis-(hexyloxy)-phenylene-(one-cyano vinylene)] (CN-PPV), a polyphenylene vinylene (PPV) derivative, poly(9,9-dioctyl fluorene) (PDAF), and police pyro. Macromolecule precursor such as PPV precursor or PPP precursor can be used as well. In addition, existing luminescent materials can be used.

By means of dissolution to solvent of these organic luminescent materials, organic luminescence inks are made. As solvent for dissolution of organic luminescent material, the following materials are exemplified. Toluene, dimethylbenzene, acetone, anisole, methyl ethyl ketone, methyl isobutyl ketone, cyclohexanone, and mixture thereof. Above all, in an aspect of solubility of organic luminescent material, aromatic organic solvent such as toluene, dimethylbenzene or anisole is desirable. In addition, detergent, antioxidant, viscosity improver, UV absorber may be added in organic luminescence ink. However, these additives must not affect luminescence property of an organic electroluminescence display unit.

For formation method of organic luminous layer with the use of organic luminescence ink of the present invention, relief printing method can be used.

Offset printing is explained. Ink is attached to the printing plate that streak is formed. The ink is transferred from printing plate to elastic smooth blanket. Even more particularly, ink is transferred from blanket to a substrate. Ink on blanket before being transferred to a substrate is ink in semidry state. Ink pattern in semidry state is printed to a substrate. But blanket is easy to swell by means of aromatic organic solvent of organic luminescence ink. In addition, it is easy to be transformed.

Ink jet method is method to form organic luminous layer by an ejection of multiple times of organic luminescence ink from ink jet nozzles. A printed part is away from nozzle. Ink discharged by nozzle reflects back in a printed part. Therefore, partition wall must be sufficiently high.

On the other hand, by relief printing method, convex parts of relief printing plate touch a printed part. Therefore, it is not necessary to consider scattering of ink by reflection of ink. Partition wall may be low.

At first, in ink jet method, ink discharged by ink jet nozzles is supplied on a printed part. Only by means of the weight of the ink, ink spreads on a part partitioned off by partition wall. On the other hand, in relief printing method, convex parts of relief printing plate touch a printed part. Therefore, a printed part is forced by means of printing plate. Relief printing plate buries space partitioned off by partition wall. Ink spreads to a lateral direction in a part partitioned off by partition wall. In ink jet method, organic luminescence ink is hard to be printed in an edge of a printed part. There is case without ink on a part near partition wall. In relief printing method, ink is easy to stick to a printed part.

From such a reason, relief printing method is preferred in formation of organic luminous layer. All printing methods to use relief printing plate are defined as relief printing method in a wide sense. However, relief printing method of an embodiment of the present invention is a printing method to use relief printing plate comprising a rubber printing plate or resin printing plate. In addition, relief printing method to use rubber relief printing plate is referred to as flexography in a printing industry. In addition, relief printing method using plastic plate is referred to as a plastic plate printing method. In the present invention, both printing methods are referred to as relief printing method.

Relief printing plate with the use of a photosensitive resin can be used as plastic plate of the present invention. Relief printing plate with the use of a photosensitive resin can be produced by the following method: Exposure process; development process; and bake process. In development process, solvent development type and water development type are exemplified. The main component of material of printing plate can be a hydrophobic component or a hydrophilic component. Solvent development type photosensitive resin relief printing plate does not resist aromatic type organic solvent such as toluene or dimethylbenzene used as organic luminescence ink solvent. Therefore, solvent development type photosensitive resin relief printing plate cannot be used for relief printing plate of organic electroluminescence printing. On the other hand, water development type photosensitive resin relief printing plate resist organic solvent of aromatic type. In the present invention, water development type photosensitive resin relief printing plate is preferable.

Figure 4:
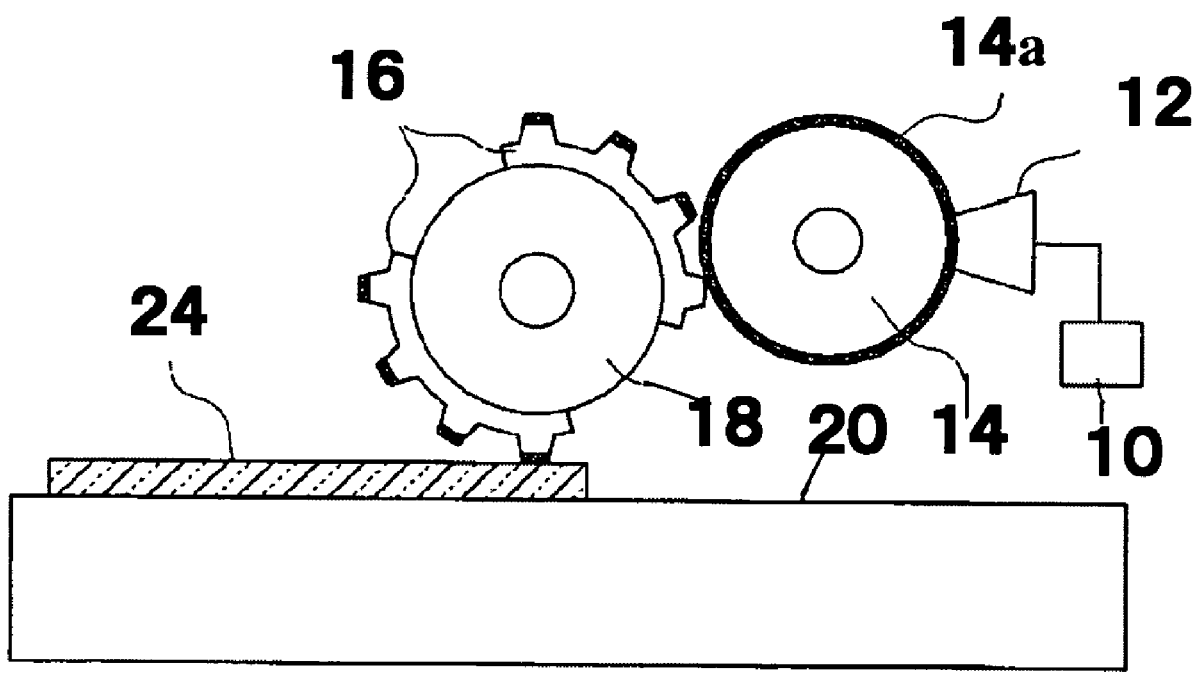
FIG. 4 shows a schematic of a relief printing apparatus.

FIG. 4 is a schematic illustration of relief printing apparatus printing organic luminescence ink comprising organic luminescent material in the substrate including the first electrode, partition wall and a hole transport layer. This printer has ink tank 10, ink chamber 12, anilox roll 14 and plate cylinder 18 on which relief printing plate 16 is put. Organic luminescence ink diluted with solvent is taken to ink tank 10. Organic luminescence ink is sent into ink chamber 12 from ink tank 10. Anilox roll 14 contacts with ink feed section of ink chamber 12, and it is supported rotatably.

With rotation of anilox roll 14, thickness of ink layer 14a of organic luminescence ink supplied in anilox roll surface becomes uniform. The ink of this ink layer is transferred on a convex part of relief printing plate 16 carried by plate cylinder 18 rotationally driven in proximity to anilox roll. The substrate including the transparent electrode and a hole transport layer are transported to printing position of flat-bed printing machine 20 by the transporting means that are not illustrated. Ink on convex parts of relief printing plate 16 is printed on substrate 24. Drying of substrate 24 is performed if necessary. Organic luminous layer is formed on substrate 24.

After formation of organic luminous layer 4, the second electrode 5 is formed. The case that second electrode 5 is cathode is explained. A cathode material which depends upon luminescence property of organic luminous layer can be used. In some embodiments, metal substance such as lithium, magnesium, calcium, ytterbium, aluminium, and alloy of these metals and the metal which are stable such as gold or silver can be used. In addition, conductive oxides of indium, zinc tin and the like can be used. As formation method of a cathode layer, the vacuum evaporation that uses mask is exemplified.

Glass cap and adhesive are used, and the organic electroluminescence assembly is sealed last to protect the organic electroluminescence assembly from external oxygen and moisture. In addition, agent to seal and flex film or glass plate are used, and the organic electroluminescence assembly may be sealed.

In addition, organic electroluminescent device can, in some embodiments include a first electrode that is anode and a second electrode that is cathode. Between the anode and the cathode, a hole transport layer and an organic luminous layer are laminated from the anode side sequentially. A hole injection layer, a hole transport layer, an electronic blocking layer, a hole blocking layer, an electron transport layer and an electron injection layer may be laminated between the anode and the cathode if necessary.

In addition, a hole transport layer, a hole injection layer and a electronic blocking layer are layers having material having hole transport characteristic and/or electron block characteristic. These layers have the next roles, respectively: The role which reduces barrier of hole injection from the anode to organic luminous layer; The role which sends a hole poured by the anode to direction of the cathode; and The role which disturbs that electron advances to anodal direction while maintaining a hole. A hole blocking layer and an electron transport layer are layers having material having electron transport property and/or a hole block characteristic. These layers have the next roles, respectively: The role which makes poured electron advance from the cathode to the anodal direction; and The role which disturbs the situation that hole goes to direction of the cathode layer while maintaining electron.

In addition, in one embodiment, the first electrode can be anode and the second electrode can be cathode. However, in the present invention, the configuration that the first electrode is cathode and the second electrode is anode is preferable.

Some of the noted effects of the embodiments of the present invention are now discussed. In an embodiment of the present invention, partition wall of height of 0.5 μm-5 μm is formed between pixel electrodes. Organic luminescent material disperses in stability in solvent. Organic luminescence ink is made. Organic luminescence ink is printed to pixel electrode partitioned off by partition walls by relief printing method. Then organic luminous layer is formed. Without mixed color in a pixel and failure of display by disconnection of a cathode layer, high minute organic electroluminescence display is obtained.

When height of partition wall is 1.0 μm-1.8 μm, there is the next merit. In the case that organic luminescence ink of low concentration is used, there are no mixed colors in a pixel. And in the case of a thick organic luminous layer, there is no mixed colors in a pixel. In addition, high minute organic electroluminescence display without unevenness in thickness of partition wall can be obtained at low costs.

EXAMPLE 1

An example is described. Thin film of ITO (an indium tin oxide) was formed by sputter method to a glass substrate of diagonal 1.8 inches size. By means of photolithography method and etching by acid solution, patterning of thin film of ITO was done, and the first electrode which was anode was formed. Configuration of the first electrode is described. The line width was 136 μm. Space was 30 μm. 192 first electrodes were formed in about 32 mm width.

Partition wall was formed as follows next. A whole area of the glass substrate which formed the first electrode was provided with photoresist material of modacrylic of negative type by spin coat. Under conditions of the following, it was coated once. It is rotation for five seconds in 150 rpm. It is rotation for 20 seconds in 1000 rpm next. Height of partition wall was 0.5 μm. By photolithography method, partition wall of line pattern was formed between the first electrodes.

Thereupon, polymer membrane comprising PEDOT was formed by spin coat method. This polymer membrane was a hole transport layer. A polyphenylene vinylene derivative (organic luminescent material) was dissolved in toluene. Density of a polyphenylene vinylene derivative was 1%. This was organic luminescence ink. This organic luminescence ink was used, and organic luminous layer was formed by relief printing method on pixel electrodes between partition walls. Anilox roll of 150 Line/inch and water development type photosensitive resin printing plate were used. The film thickness of organic luminous layer after printing and drying was 80 nm.

Thereupon, the second electrode of form of line which was cathode comprising Al, Ca was formed. The second electrode was perpendicular to the first electrode. The second electrode was formed using a mask by vacuum evaporation of resistance heating mode. Glass cap and adhesive were used, and the organic electroluminescent assembly was sealed last to protect the organic electroluminescent assembly from external oxygen and moisture. Organic electroluminescent device was made in this way. A fringe of display of organic electroluminescent device was provided with fetch electrodes of the first electrode and the second electrode.

EXAMPLE 2

Spin coating condition when partition wall was formed is described below. Rotation for five seconds of 150 rpm and rotation for 20 seconds of 300 rpm. It was coated twice. Height of partition wall was 5 µm. In addition, organic electroluminescent device was made by means of method same as example 1.

EXAMPLE 3

Spin coat condition when partition wall was formed is described below. Rotation for five seconds of 150 rpm and rotation for 20 seconds of 800 rpm. It was coated once. Height of partition wall was 1.0 µm. In addition, in printing of organic luminous layer, organic luminous layer of thickness 160 nm was got using anilox roll of 200 Line/inch. In addition, organic electroluminescent device was made by means of method same as example 1.

EXAMPLE 4

Spin coat condition when partition wall was formed is described below. Rotation for five seconds of 150 rpm and rotation for 20 seconds of 400 rpm. It was coated once. Height of partition wall was 1.8 µm. In addition, organic luminous layer of thickness 160 nm was got using anilox roll of 200 Line/inch in printing of organic luminous layer. In addition, organic electroluminescent device was made by means of method same as example 1.

EXAMPLE 5

Spin coating condition when partition wall was formed is described below. Rotation for five seconds of 150 rpm and rotation for 20 seconds of 800 rpm. It was coated once. Height of partition wall was 1.0 µm. Developing of photolithography method for formation of partition wall was mild. In addition, in printing of organic luminous layer, organic luminous layer of thickness 160 nm was got using anilox roll of 200 Line/inch. In addition, organic electroluminescent device was made by means of method same as example 1.

COMPARATIVE EXAMPLE 1

Partition wall was not made. In addition, an organic electroluminescence display panel was made by means of method same as example 1.

COMPARATIVE EXAMPLE 2

Spin coating condition when partition wall was formed is described below. Rotation for five seconds of 150 rpm and rotation for 20 seconds of 1200 rpm. It was coated once. The height of partition wall was 0.3 µm. In addition, organic electroluminescent device was made by means of method same as example 1.

COMPARATIVE EXAMPLE 3

Spin coating condition when partition wall was formed is described below. Rotation for five seconds of 150 rpm and rotation for 20 seconds of 300 rpm. It was coated three times. The height of partition wall was 7.5 µm. In addition, organic electroluminescent device was made by means of method same as example 1.

COMPARATIVE EXAMPLE 4

Spin coating condition when partition wall was formed is described below. Rotation for five seconds of 150 rpm and rotation for 20 seconds of 1000 rpm. It is coated once. Height of partition wall was 0.5 µm. In addition, in printing of organic luminous layer, organic luminous layer of thickness 160 nm was got by using anilox roll of 200 Line/inch. In addition, organic electroluminescent device was made by means of method same as example 1.

(estimate)

About example 1, 2, 3, 4, 5 and comparative example 1, 2, 3, 4, it was examined by means of the following method. Organic luminescence ink was printed on a substrate by relief printing method. Organic luminescence ink was dried. Line pattern configuration of formed organic luminous layer was observed.

About example 1, 2, 3, 4, 5 and comparative example 1, 2, 3, 4, it was examined by means of the following method. Takeout electrodes of the first electrode and the second electrode were connected to a power supply. Lighting display of organic electroluminescent device was confirmed. Poor display depending on existence or nonexistence of disconnection of the second electrode was checked.

About example 3, 5, cross-sectional observation was performed for formed partition wall. Configuration of partition wall and presence of a hem part were confirmed. In addition, in the case of confirmation of lighting display of this organic electroluminescent device, color unevenness in a pixel was confirmed.

The above-mentioned estimate result is shown for Table 1.

TABLE 1

| | Height of partition wall (h) | Thickness of organic luminous layer | Existence of a hem in partition wall | Estimate | | |
|---|---|---|---|---|---|---|
| | | | | Display state | | |
| | | | | Color mixed | Display failure depending on disconnection of the second electrode | Color unevenness in a pixel |
| EXAMPLE 1 | 0.5 µm | 80 nm | — | nothing | nothing | — |
| EXAMPLE 2 | 5.0 µm | 80 nm | — | nothing | nothing | — |
| EXAMPLE 3 | 1.0 µm | 160 nm | Non existence | nothing | nothing | observed |
| EXAMPLE 4 | 1.8 µm | 80 nm | — | nothing | nothing | — |
| EXAMPLE 5 | 1.0 µm | 160 nm | existence | nothing | nothing | nothing |
| COMPARATIVE EXAMPLE 1 | — | 80 nm | — | observed | nothing | — |
| COMPARATIVE EXAMPLE 2 | 0.3 µm | 80 nm | — | observed | nothing | — |

TABLE 1-continued

| | Height of partition wall (h) | Thickness of organic luminous layer | Existence of a hem in partition wall | Estimate Display state Color mixed | Display failure depending on disconnection of the second electrode | Color unevenness in a pixel |
|---|---|---|---|---|---|---|
| COMPARATIVE EXAMPLE 3 | 7.5 μm | 80 nm | — | nothing | observed | — |
| COMPARATIVE EXAMPLE 3 | 0.5 μm | 160 nm | — | observed | nothing | — |

Result of example 1, 2, 3, 4 or 5 is described below. Organic luminous layer was equivalent to pixel electrodes. Location accuracy of organic luminous layer was preferable. Display state of a display unit was good, too. On the other hand, in comparative example 1, comparative example 2 and comparative example 4, extrusion of ink to neighboring pixel electrodes was observed. In addition, in comparative example 3, poor luminescence of a display unit was confirmed, and, in detailed observation of a display panel, breaking of wire of cathode was observed.

Thus, comparative example 2 and example 1 show the following result. When organic luminescence ink of density 1% was used, and organic luminous layer of film thickness of 80 nm was formed, partition wall of height of 0.5 μm was necessary. When height of partition wall was 0.5 μm, organic luminescence ink did not overflow to neighboring pixel electrodes.

Even more particularly, comparative example 4 and comparative example 3 show the following result. When film thickness of organic luminous layer was 160 nm, partition wall of height of 1.0 μm was necessary. When height of partition wall is 1.0 μm, the organic luminescence ink did not overflow to neighboring pixel electrodes.

In addition, example 2 and comparative example 3 shows the following result. When partition wall height was 5 μm, the cathode was not snapped. When height of partition wall was 7.51 μm, cathode was snapped. In addition, in example 2 and comparative example 3, height of partition wall was uneven. In addition, in other examples and comparative example, there was not the unevenness in height of partition wall.

In addition, in cross-sectional observation of partition wall of example 3, the partition wall did not have a hem. In cross-sectional observation of partition wall of example 5, apical angle of a hem was 40°, and width of a hem was 10 μm. Emissive display of organic electroluminescent device of example 3, 5 was confirmed. There was color unevenness between a central portion of a pixel and a part near partition wall in example 3. There was not the color unevenness in example 5.

What is claimed is:

1. A manufacturing method of organic electroluminescent device, the device including a substrate, a first electrode on the substrate, a partition wall adjacent to the first electrode, an organic luminescence media layer on the first electrode including an organic luminous layer, and a second electrode on the organic luminous media layer opposed to the first electrode, said method comprising:
    forming a pattern-shaped first electrode on a substrate,
    forming a partition wall of height of 0.5 μm -5 μm adjacent to the first electrode, the partition wall having a hem covering edges of the first electrode, the hem having a tapered configuration, and acroteric angle θ of the hem being less than 45°, and
    forming an organic luminous layer on the first electrode partitioned off by the partition wall by relief printing method,
    wherein the organic luminous layer is formed by using organic luminescence ink which dissolved organic luminescent material in a solvent.

2. A manufacturing method of organic electroluminescent device according to claim 1, wherein the height of the partition wall is 1.0-1.8 μm.

3. A manufacturing method of organic electroluminescent device according to claim 1, wherein the width W of the hem of the partition wall is more than 0.5 μm.

4. An organic electroluminescent device, comprising:
    a substrate;
    a first electrode on the substrate;
    a partition wall of height of 0.5 μm -5 μm adjacent to the first electrode, the partition wall having a hem covering edges of the first electrode, the hem having a tapered configuration, and acroteric angle θ of the hem being less than 45°;
    an organic luminescence media layer on the first electrode partitioned off by the partition wall, the organic luminescence media layer including an organic luminous layer; and
    a second electrode on the organic luminous media layer opposed to the first electrode.

5. An organic electroluminescent device according to claim 1,
    wherein the height of the partition wall is 1.0-1.8 μm.

6. An organic electroluminescent device according to claim 1,
    wherein width W of the hem of the partition wall is more than 0.5 μm.

* * * * *